(12) United States Patent
Snyder

(10) Patent No.: US 6,507,214 B1
(45) Date of Patent: Jan. 14, 2003

(54) DIGITAL CONFIGURABLE MACRO ARCHITECTURE

(75) Inventor: Warren Snyder, Snohomish, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 09/909,045

(22) Filed: Jul. 18, 2001

Related U.S. Application Data

(60) Provisional application No. 60/243,708, filed on Oct. 26, 2000.

(51) Int. Cl.$^7$ ................................................. H03K 7/38
(52) U.S. Cl. ............................. 326/38; 326/40; 326/37; 326/41; 326/39
(58) Field of Search ..................................... 326/38–41

(56) References Cited

U.S. PATENT DOCUMENTS 5,880,598 A * 3/1999 Duong .......................... 326/41
6,304,101 B1 * 10/2001 Nishihara ..................... 326/41

* cited by examiner

Primary Examiner—Michael Tokar
Assistant Examiner—Vibol Tan
(74) Attorney, Agent, or Firm—Wagner, Murabito & Hao LLP

(57) ABSTRACT

A new digital configurable macro architecture is described. The digital configurable macro architecture is well suited for microcontroller or controller designs. In particular, the foundation of the digital configurable macro architecture is a programmable digital circuit block. In an embodiment, programmable digital circuit blocks are 8-bit circuit modules that can be programmed to perform any one of a variety of predetermined digital functions by changing the contents of a few registers therein, unlike a FPGA which is a generic device that can be programmed to perform any arbitrary digital function. Specifically, the circuit components of the programmable digital circuit block are designed for reuse in several of the predetermined digital functions such that to minimize the size of the programmable digital circuit block.

21 Claims, 9 Drawing Sheets

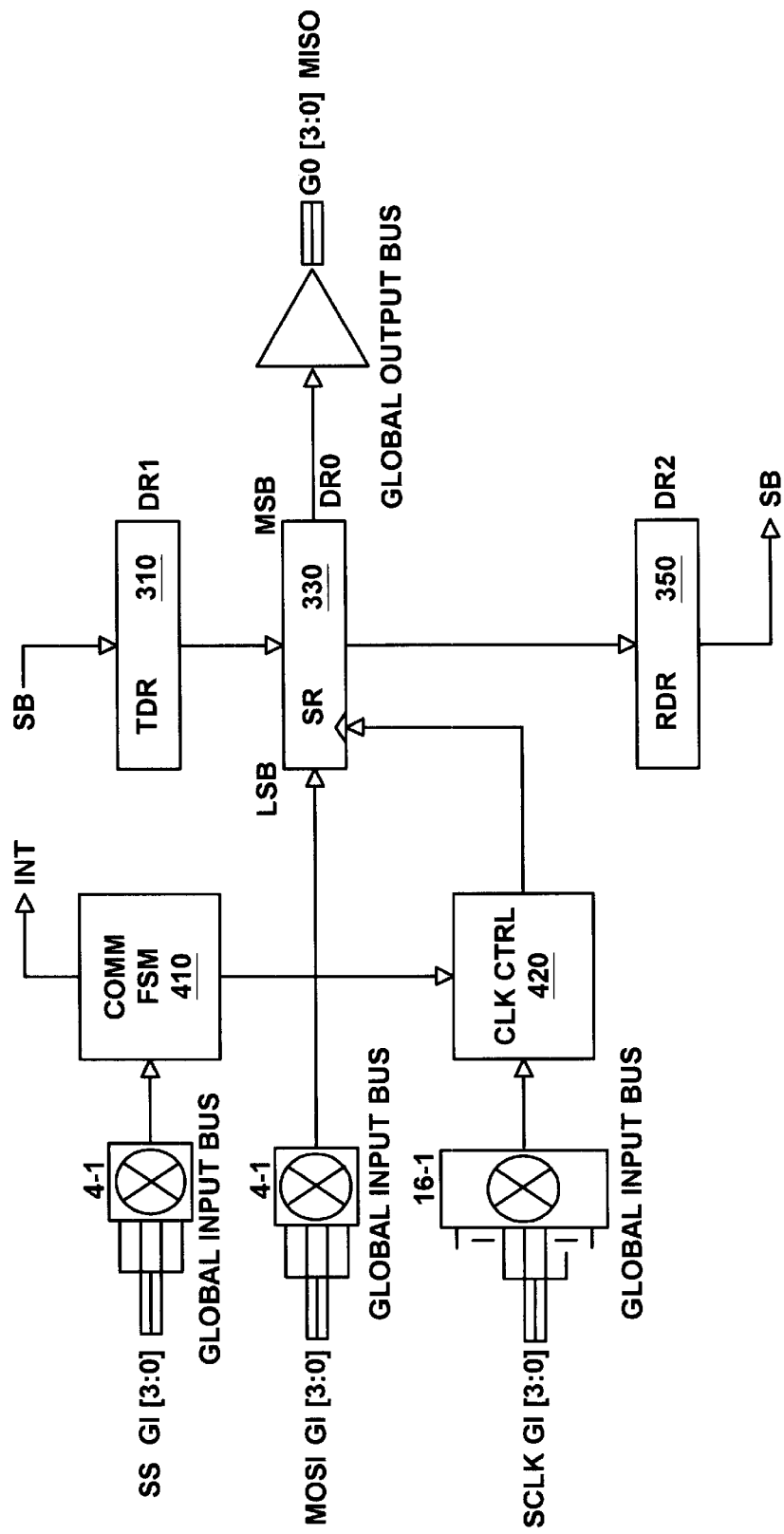

DIGITAL CONFIGURABLE MACRO ARCHITECTURE

RELATED U.S. APPLICATION

This application claims priority to the copending provisional patents application, Ser. No. 60/243,708, Attorney Docket Number CYPR-CD00167, entitled "Advanced Programmable Microcontroller Device," with filing date Oct. 26, 2000, and assigned to the assignee of the present application.

BACKGROUND OF THE INVENTION

1. Field of the Invention

The present invention generally relates to programmable digital circuits. More particularly, the present invention relates to the field of programmable digital circuits which are dynamically configurable to any one of various digital functions by changing the contents of configuration registers.

2. Related Art

Microcontrollers or controllers have been utilized in various applications for many years. Primarily, microcontrollers are used in control-oriented applications that are interrupt-driven, sensing and controlling external events. Microcontrollers are frequently found in: appliances (e.g., microwave oven, refrigerator, television, VCR, stereo), computers and computer equipment (e.g., laser printers, modems, disk drives), automobiles (e.g., engine control, diagnostics, climate control), environmental control (e.g., greenhouse, factory, home), aerospace, and thousands of other uses.

The Field Programmable Gate Array (FPGA) has become very popular in recent years, even being utilized in several microcontroller applications. One reason for its popularity is the shortage in design cycle time that may be achieved by using programmable devices. Typically, FPGAs offer the highest logic capacity. FPGAs can be programmed to realize different digital functions. In particular, many FPGAs have programmable look-up tables to realize different digital functions. Typically, a FPGA contains from a few to tens of thousands of programmable logic blocks and an even greater number of flip-flops, each programmable logic block having a look-up table, multiplexors, and flip-flops. Most FPGAs do not provide 100% interconnect between programmable logic blocks.

However, FPGAs are highly inefficient with respect to chip area, increasing their cost. Typically, less than half of the logic resources in the FPGA are used to realize a digital function. Moreover, FPGAs need to have their look-up tables re-programmed in order to enable them to implement a new digital function, which is a time consuming task.

FPGAs are not ideally suited for microcontroller applications. Microcontroller applications are very cost-sensitive. A FPGA is not able to realize the number of digital functions that are demanded by today's microcontroller applications within these strict cost constraints.

SUMMARY OF THE INVENTION

A new digital configurable macro architecture is described. The digital configurable macro architecture is well suited for microcontroller or controller designs. In particular, the foundation of the digital configurable macro architecture is a programmable digital circuit block. In an embodiment, programmable digital circuit blocks are 8-bit circuit modules that can be programmed to perform any one of a variety of predetermined digital functions by changing the contents of a few registers therein, unlike a FPGA which is a generic device that can be programmed to perform any arbitrary digital function. Specifically, the circuit components of the programmable digital circuit block are designed for reuse in several of the predetermined digital functions such that to minimize the size of the programmable digital circuit block. The programmable digital circuit blocks can be configured, for example, as timers, counters, serial communication ports, cyclic redundancy generators/checkers (CRC), or pseudo random sequence generators (PRS). The user selects the digital function that is needed and configures the programmable digital circuit block accordingly.

The programmable digital circuit blocks can be configured to coupled in series or in parallel to handle more complex digital functions. For example, a 24-bit timer can be designed by coupling three 8-bit programmable digital circuit blocks that have been individually configured as 8-bit timers. Additionally, a first programmable digital circuit block that is configured as a CRC generator can feed a second programmable digital circuit block that is configured as a serial output communication port.

More importantly, the configuration of the programmable digital circuit block is determined by its small number of configuration registers. This provides much flexibility. In particular, the configuration of the programmable digital circuit block is fast and easy since changes in configuration are accomplished by changing the contents of the configuration registers, whereas the contents are generally a small number of configuration data bits. Thus, the programmable digital circuit block is dynamically configurable from one predetermined digital function to another predetermined digital function for real-time processing.

These and other advantages of the present invention will no doubt become apparent to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 9 illustrates a block diagram of a SPI Slave configuration of a programmable digital circuit block in accordance with an embodiment of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
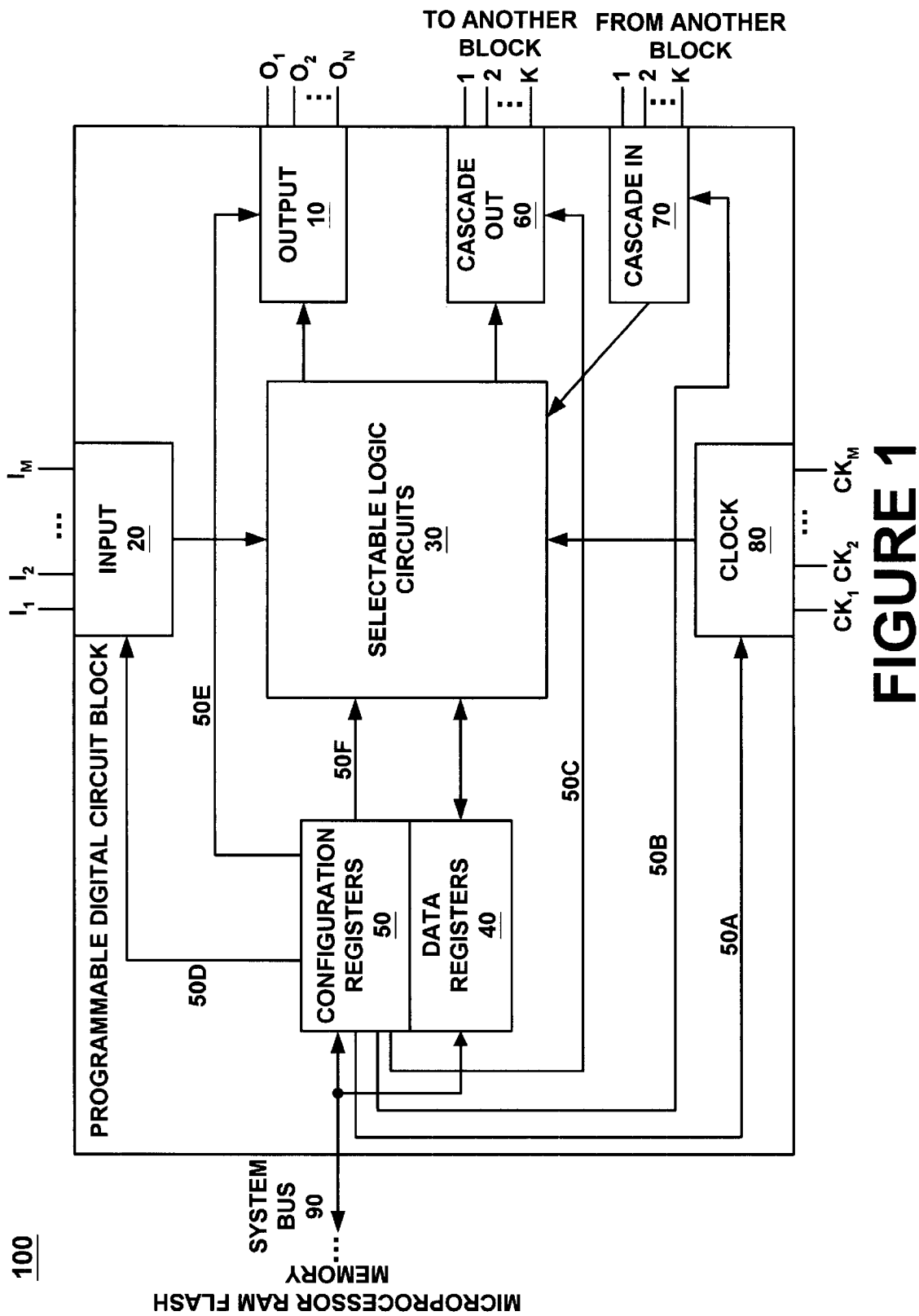
FIG. 1 illustrates a programmable digital circuit block in accordance with an embodiment of the present invention.

FIG. 1 illustrates a programmable digital circuit block 100 in accordance with an embodiment of the present invention. The programmable digital circuit block 100 is the foundation of a new digital configurable macro architecture of the present invention. The digital configurable macro architecture is well suited for microcontroller or controller designs.

The design of the programmable digital circuit block 100 in the digital configurable macro architecture was developed after examining and studying conventional microcontrollers to determine the types of digital functions that were implemented within various conventional microcontrollers. It was discovered that there were not very many different types of digital functions demanded in microcontroller applications. Furthermore, it was determined that these different types of digital functions had many circuit components in common. Moreover, it was determined that the digital functions were generally implemented as 8-bit or multiples of 8-bits because their length was generally based on the length of standard buses. This led to the development of the programmable digital circuit blocks 100, the building block of the digital configurable macro architecture.

In an embodiment, the programmable digital circuit block 100 is an 8-bit circuit module that can be programmed to perform any one of a variety of predetermined digital functions (which are useful in microcontroller applications) by changing the contents of a few configuration registers 50 therein, unlike a FPGA which is a generic device that can be programmed to perform any arbitrary digital function. Specifically, the circuit components of the programmable digital circuit block 100 are designed for reuse in several of the predetermined digital functions such that to minimize the size of the programmable digital circuit block 100. Hence, the programmable digital circuit block 100 is highly efficient in terms of die area. In an embodiment, the programmable digital circuit block 100 can be configured as a timer, a counter, a pulse width modulator (PWM), a cyclic redundancy generator/checker (CRC), a pseudo random sequence generator (PRS), a dead zone delay, a UART (universal asynchronous receiver-transmitter) transmitter, a UART (universal asynchronous receiver-transmitter) receiver, a SPI (serial peripheral interface) Master, or a SPI (serial peripheral interface) Slave.

In another embodiment, the programmable digital circuit block 100 can be configured as a timer, a counter, a pulse width modulator (PWM), a cyclic redundancy generator/checker (CRC), a pseudo random sequence generator (PRS), or a dead zone delay, whereas the digital communication functions (e.g., UART and SPI) are eliminated to further reduce the size of the programmable digital circuit block 100. In particular, the user selects the digital function that is needed and configures the programmable digital circuit block 100 accordingly. It should be understood that the programmable digital circuit block 100 can be designed to implement other digital functions.

A design can have an array of programmable digital circuit blocks 100 which can be configured to coupled together in series or in parallel to handle more complex digital functions or to increase precision. For example, a 24-bit timer can be designed by coupling three 8-bit programmable digital circuit blocks 100 that have been individually configured as 8-bit timers. Similarly, the 8-bit timer can be extended to 16- or 32-bit digital functions by coupling multiple programmable digital circuit blocks 100 together. Additionally, a first programmable digital circuit block that is configured as a CRC generator can feed a second programmable digital circuit block that is configured as a serial output communication port, reducing device programming and increasing performance.

More importantly, the configuration of the programmable digital circuit block 100 is determined by its configuration registers 50. The programmable digital circuit block 100 generally has one or more configuration registers 50. This provides much flexibility. In particular, the configuration of the programmable digital circuit block 100 is fast and easy to configure and re-configure since changes in configuration are accomplished by changing the contents of the configuration registers 50, whereas the contents are generally a small number of configuration data bits. Thus, the programmable digital circuit block 100 is dynamically configurable from one predetermined digital function to another predetermined digital function for real-time processing. In contrast, FPGAs need to have their look-up tables re-programmed in order to have them implement a new digital function, a time-consuming task that is not done in real-time processing.

Referring to FIG. 1, in an embodiment the programmable digital circuit block 100 includes one or more configuration registers 50, one or more data registers 40, a plurality of selectable logic circuits 30, one or more configurable inputs 20, one or more configurable outputs 10, one or more cascade outputs 60, one or more cascade inputs 70, a clock input 80, and a system input 90. It should be understood that the programmable digital circuit block 100 can have other designs including lengths other than 8-bits.

The configuration registers 50 are programmed via the system bus 90. Any device, such as a microprocessor using data stored in a RAM or flash memory, can program (or write to) the configuration registers. The configuration registers 50 receive and store a plurality of configuration data corresponding to any one of the plurality of predetermined digital function described above. The programmed configuration registers 50 configure the programmable digital circuit block 100 to perform any one of the predetermined digital functions based on the configuration data. Moreover, the configuration registers 50 can be dynamically programmed with the configuration data for real-time processing. In addition, the configuration data includes (1) bits for indicating one of the predetermined digital functions and configuring the selectable logic circuits 30, (2) bits for configuring and selecting the configurable inputs 20 and the configurable outputs 10 and the clock input 80, (3) bits for indicating the mode of the predetermined digital function (e.g., parity, no parity, etc.), (4) bits for indicating the length of the predetermine digital function if several programmable digital circuit block 100 are coupled together (e.g., 8-bit, 16-bit, 24-bit, etc.), and (5) bits for indicating and configuring the interface between adjacent programmable digital circuit blocks 100 that are coupled together (e.g., configuring and selecting the cascade inputs 70 and the cascade outputs 60 for serial or parallel interfacing).

In general, the number of bits in the configuration data is sufficiently small to enable the configuration registers 50 to be programmed on-the-fly so that the programmable digital circuit block 100 can be dynamically configured and interfaced. Thus, the programmable digital circuit blocks 100 can be configured as a timer for a first length of time, re-configured as a counter for a second length of time, re-configured as a PWM for a third length of time, and so on, for real-time processing. For example, it is possible for a single register write to configure the programmable digital circuit block 100 from a timer to a PWM or to a counter or to a CRC generator or etc.

The connections 50A–50F between the configuration registers 50 and other components of the programmable digital circuit block 100 enable the configuration registers 50 to properly configure the programmable digital circuit block 100 to any one of the predetermined digital functions and to properly interface the programmable digital circuit block 100 with other programmable digital circuit blocks in series or in parallel.

Continuing with FIG. 1, the selectable logic circuits 30 are tailored such that they have a minimum set of circuit resources that can be programmed by the configuration registers 50 to implement any one of a variety of predetermined digital functions, unlike the FPGA where a substantial amount of circuit resources may remain unused. In particular, the design and structure of the selectable logic circuits 30 are dependent on the predetermined digital functions such that to minimize the size of the programmable digital circuit block 100. The fixed number of digital functions for the programmable digital circuit block 100 substantially influences the design of the programmable digital circuit block 100, providing cost savings and improving performance. The configuration registers 50 configure and select any of the selectable logic circuits 30 to perform one of the predetermined digital functions based on the configuration data. More importantly, the selectable logic circuits 30 are reused in several of the predetermined digital functions as will be illustrated below, ensuring the size efficiency of the programmable digital circuit block 100. In an embodiment, the selectable logic circuits 30 include a plurality of logic gates.

Moreover, the selectable logic circuits 30 realize any one of the variety of predetermined digital functions by using the data registers 40 to receive data, load data, capture data, etc. Thus, the data registers 40 are also reused in several of the predetermined digital functions as will be illustrated below.

Again referencing FIG. 1, the cascade outputs 60 and the cascade inputs 70 are selected and configured according to the configuration data. The cascade outputs 60 allow the programmable digital circuit block 100 to output signals for directly interfacing with adjacent or neighboring programmable digital circuit blocks. The cascade inputs 70 allow the adjacent or neighboring programmable digital circuit blocks to send signals that directly interface and are received by the programmable digital circuit block 100. Specifically, the cascade outputs 60 and the cascade inputs 70 enable multiple programmable digital circuit blocks to seamlessly interface to handle more complex digital functions or to increase precision as described above (e.g., 32-bit timer, CRC generator and SPI Master, 24-bit counter, etc.).

Figure 2:
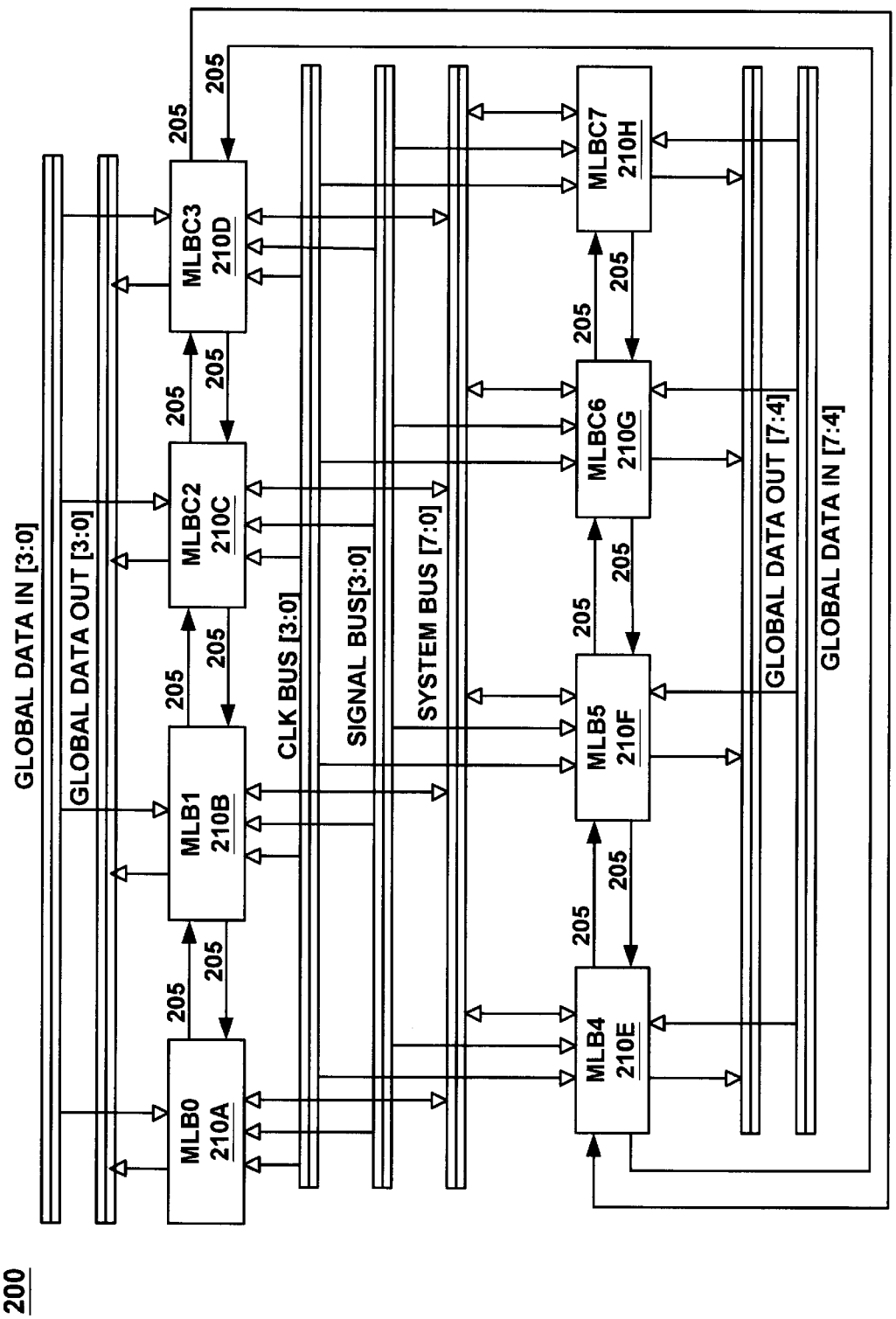
FIG. 2 illustrates a block diagram of an exemplary programmable digital device having a plurality of programmable digital circuit blocks in accordance with an embodiment of the present invention.

FIG. 2 illustrates a block diagram of an exemplary programmable digital device 200 having a plurality of programmable digital circuit blocks 210A–210H in accordance with an embodiment of the present invention. The plurality of programmable digital circuit blocks 210A–210H includes a first group and a second group. The first group includes the programmable digital circuit blocks 210A–210B and 210E–210F. Moreover, each programmable digital circuit block of the first group can be configured as a timer, a counter, a pulse width modulator (PWM), a cyclic redundancy generator/checker (CRC), a pseudo random sequence generator (PRS), or a dead zone delay. The second group includes the programmable digital circuit blocks 210C–210D and 210G–210H. Moreover, each programmable digital circuit block of the second group can be configured as a timer, a counter, a pulse width modulator (PWM), a cyclic redundancy generator/checker (CRC), a pseudo random sequence generator (PRS), a dead zone delay, a UART (universal asynchronous receiver-transmitter) transmitter, a UART (universal asynchronous receiver-transmitter) receiver, a SPI (serial peripheral interface) Master, or a SPI (serial peripheral interface) Slave.

As illustrated in FIG. 2, adjacent or neighboring programmable digital circuit blocks are interfaced via cascade lines 205 (input or output) as described above. The cascade lines 205 enable the programmable digital circuit blocks 210A–210H to seamlessly interface to handle more complex digital functions or to increase precision. For example, a 32-bit counter can be designed by coupling four 8-bit programmable digital circuit blocks that have been individually configured as 8-bit counters. Similarly, the 8-bit counter can be extended to 16- or 24-bit digital functions by coupling multiple programmable digital circuit blocks together. Additionally, a first programmable digital circuit block that is configured as a CRC generator can feed a second programmable digital circuit block that is configured as a serial output communication port, reducing device programming and increasing performance.

Moreover, the exemplary programmable digital device 200 includes a signal bus for digitized analog signals, a clock bus, a system bus for programming the programmable digital circuit blocks 210A–210H, and a plurality of global data buses for transmitting data to/from the programmable digital circuit blocks 210A–210H.

Figure 3:
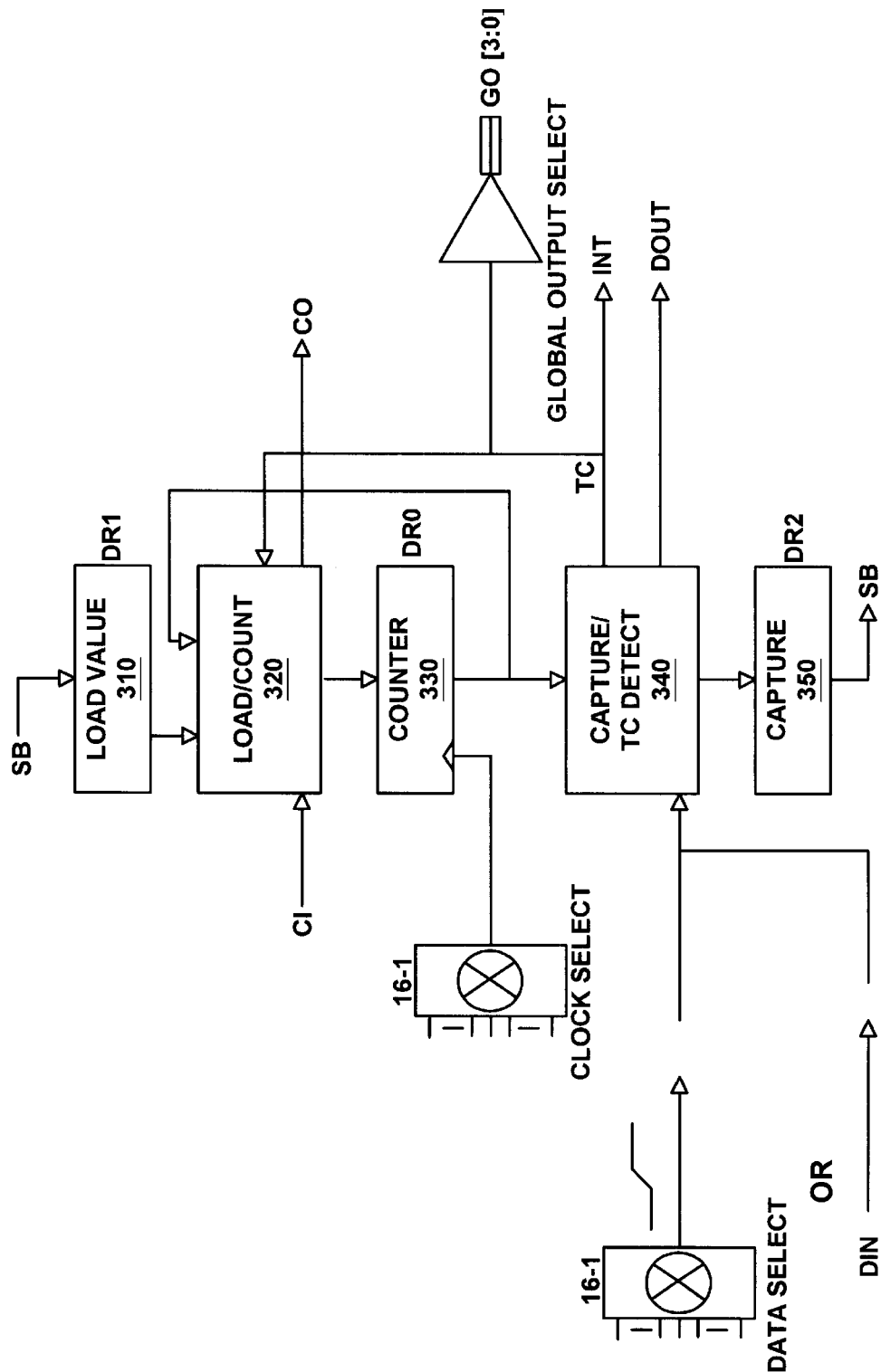
FIG. 3 illustrates a block diagram of a timer configuration of a programmable digital circuit block in accordance with an embodiment of the present invention.
Figure 4:
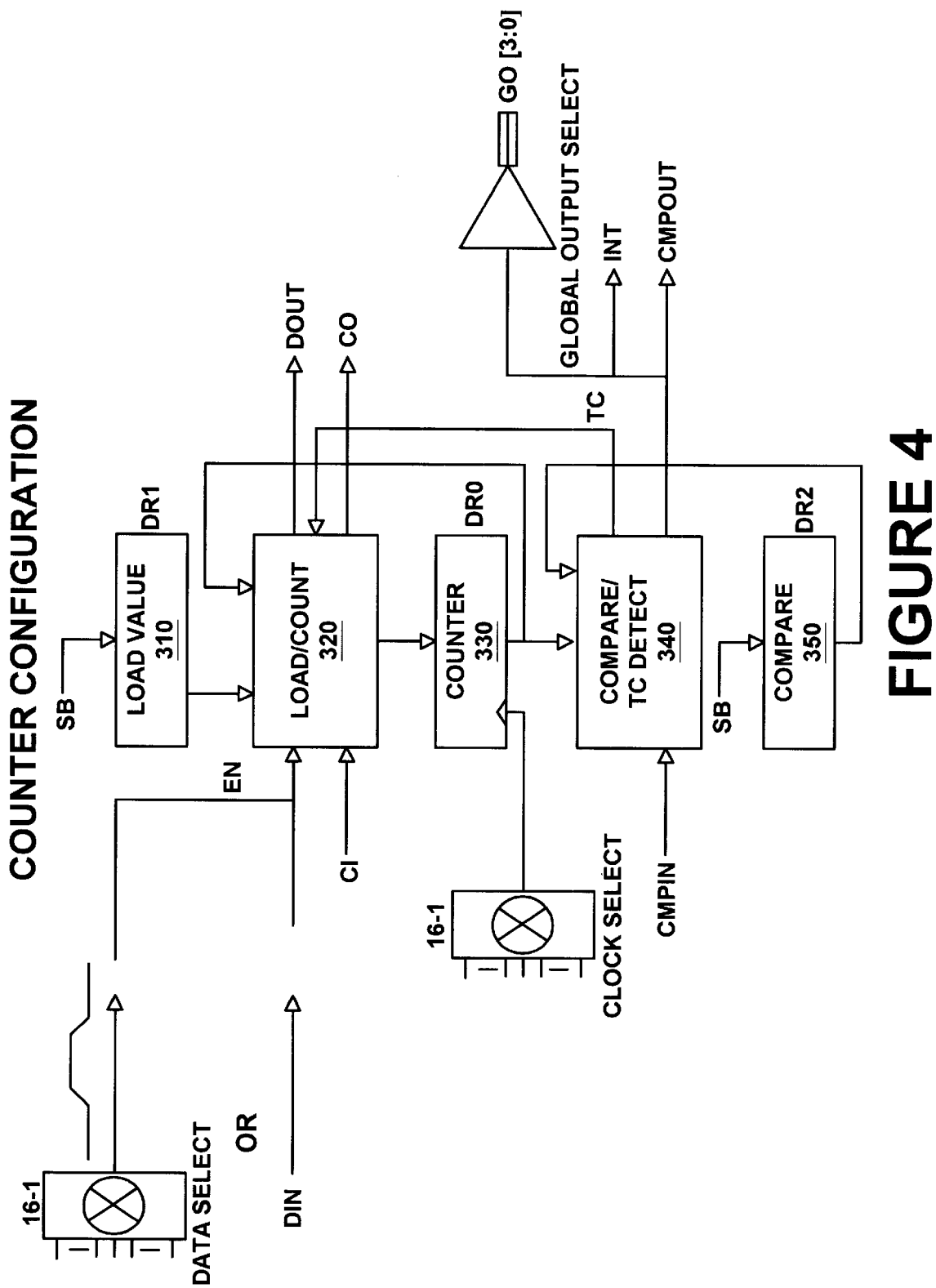
FIG. 4 illustrates a block diagram of a counter configuration of a programmable digital circuit block in accordance with an embodiment of the present invention.
Figure 5:
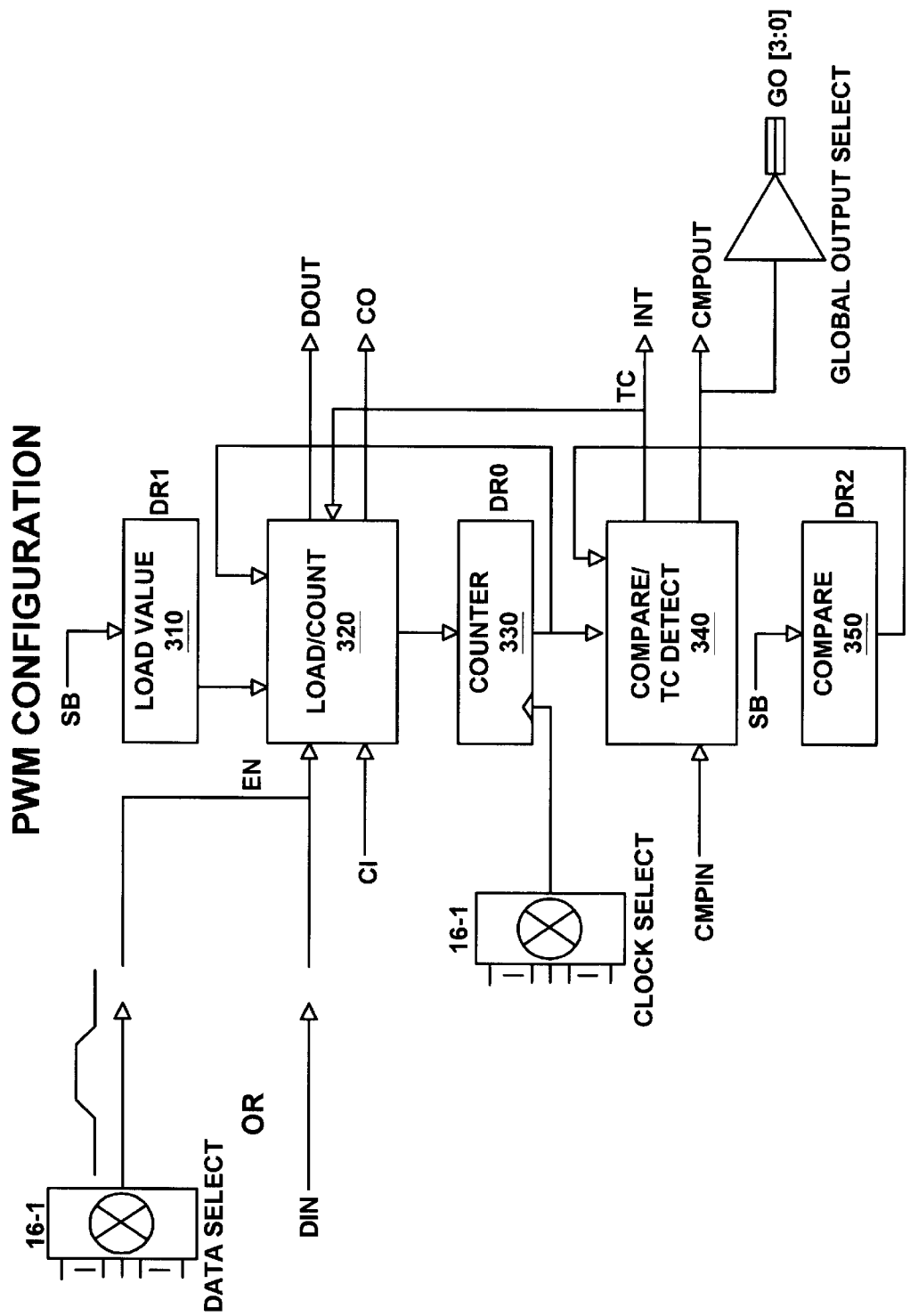
FIG. 5 illustrates a block diagram of a pulse width modulator (PWM) configuration of a programmable digital circuit block in accordance with an embodiment of the present invention.

FIG. 3 illustrates a block diagram of a timer configuration of a programmable digital circuit block in accordance with an embodiment of the present invention. FIG. 4 illustrates a block diagram of a counter configuration of a programmable digital circuit block in accordance with an embodiment of the present invention. FIG. 5 illustrates a block diagram of a pulse width modulator (PWM) configuration of a programmable digital circuit block in accordance with an embodiment of the present invention.

As illustrated in FIGS. 3–5, the selectable logic circuits 320 and 340 are reused for the timer, counter, and PWM configurations. Moreover, the first data register 310, the second data register 330, and the third data register 350 of the programmable digital circuit block are reused for the timer, counter, and PWM configurations. In essence, the configuration data loaded onto the configuration registers determines how the data registers 310, 330, and 350 are to be used, what operation is to be performed on the data by the selectable logic circuits 320 and 340, where the input data is selected from (e.g., system bus (SB), signal bus, global bus, etc.), where the output data is transmitted, what clock signal is to be used, what are the cascade inputs (e.g., DIN, CI, etc.) from other programmable digital circuit blocks, what are the cascade outputs (e.g., DOUT, CO, etc.) to other programmable digital circuit blocks, when to generate an interrupt (INT), and what is the data flow within the programmable digital circuit block so that the programmable digital circuit block can properly perform any one of the predetermined digital functions.

Figure 6:
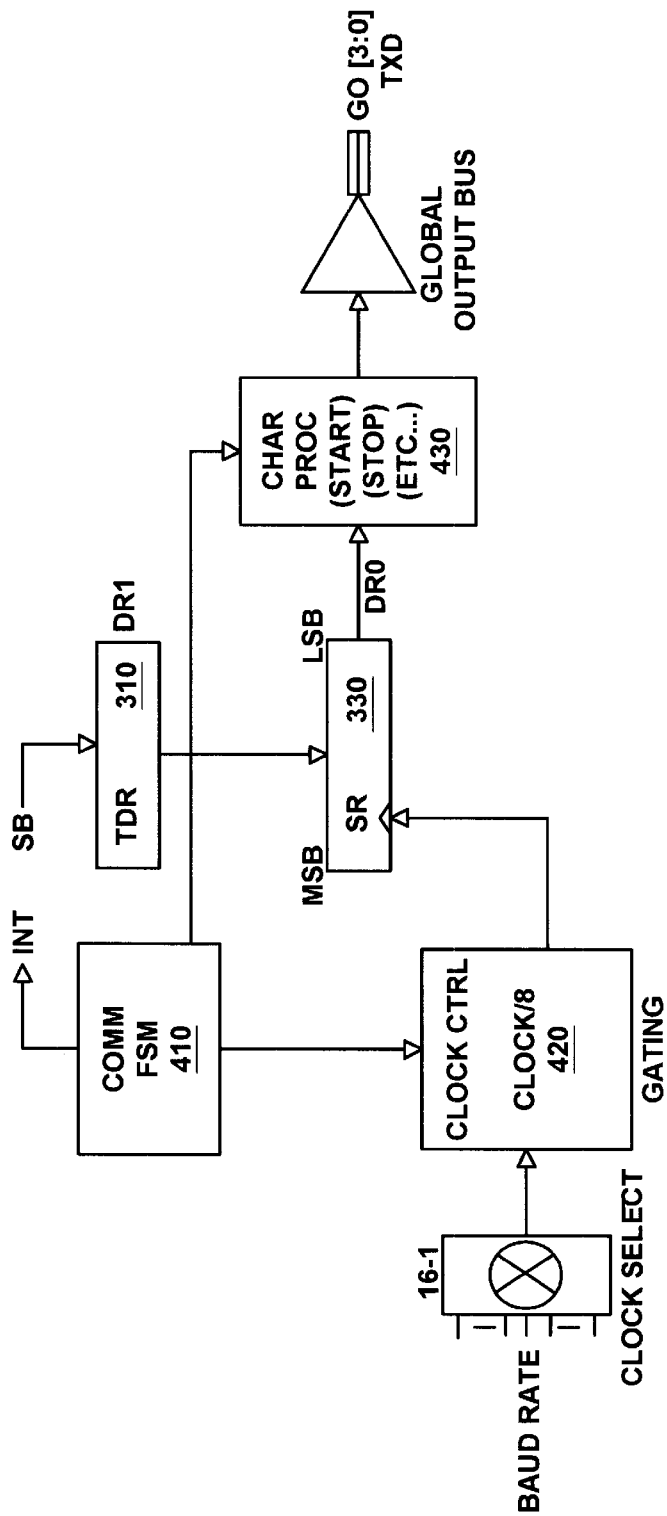
FIG. 6 illustrates a block diagram of a UART transmitter configuration of a programmable digital circuit block in accordance with an embodiment of the present invention.
Figure 7:
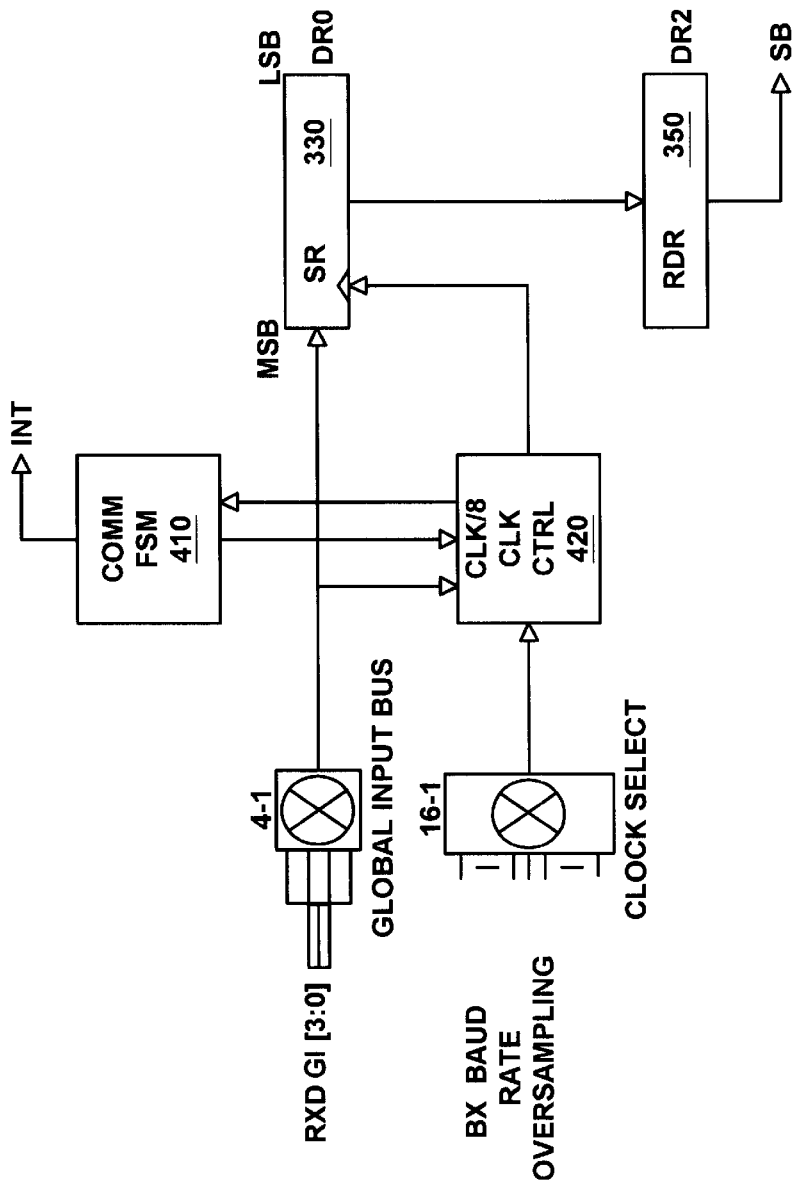
FIG. 7 illustrates a block diagram of a UART receiver configuration of a programmable digital circuit block in accordance with an embodiment of the present invention.
Figure 8:
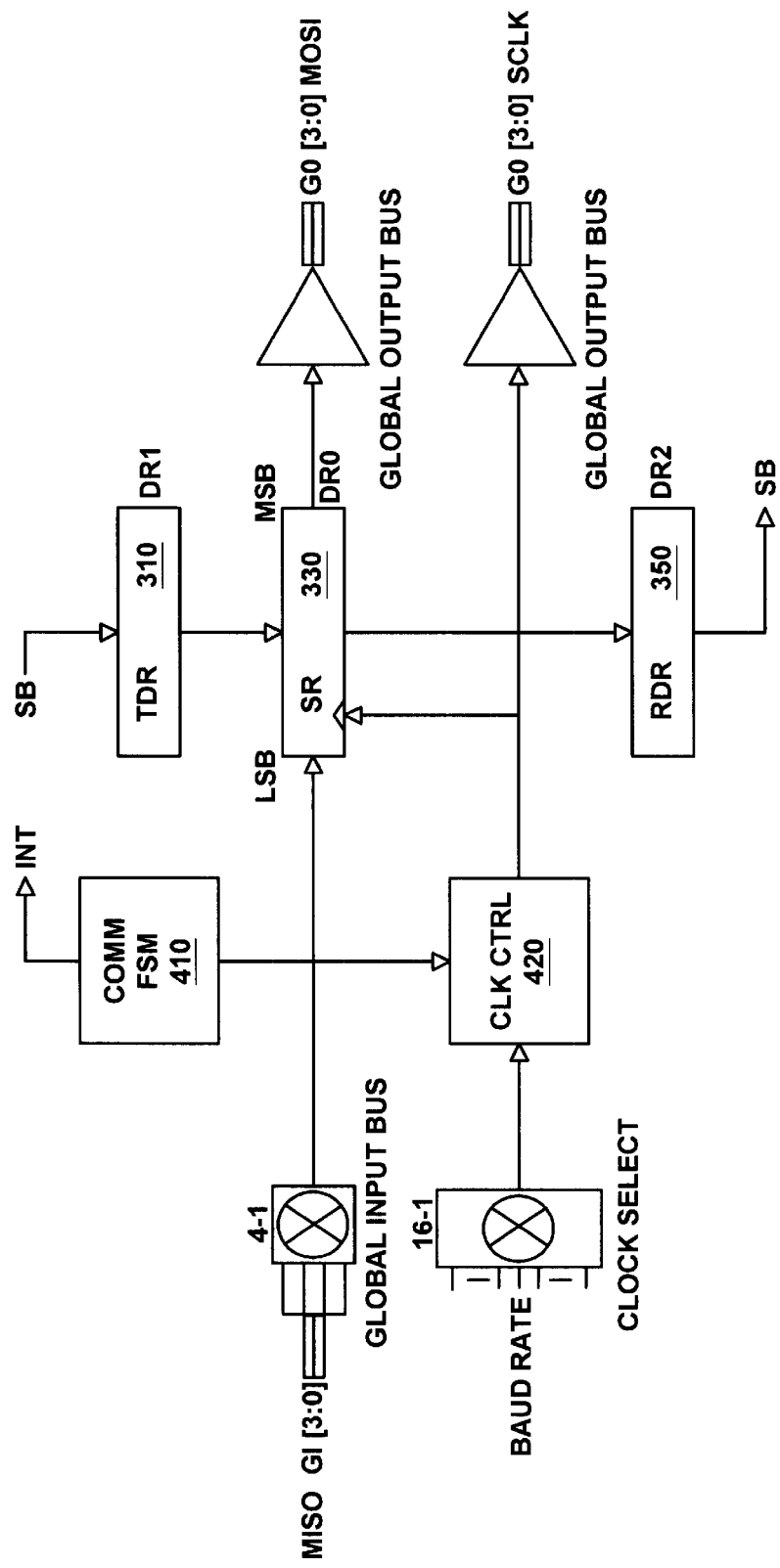
FIG. 8 illustrates a block diagram of a SPI Master configuration of a programmable digital circuit block in accordance with an embodiment of the present invention.

FIG. 6 illustrates a block diagram of a UART transmitter configuration of a programmable digital circuit block in accordance with an embodiment of the present invention. FIG. 7 illustrates a block diagram of a UART receiver configuration of a programmable digital circuit block in accordance with an embodiment of the present invention. FIG. 8 illustrates a block diagram of a SPI Master configuration of a programmable digital circuit block in accordance with an embodiment of the present invention. FIG. 9 illustrates a block diagram of a SPI Slave configuration of a programmable digital circuit block in accordance with an embodiment of the present invention.

As illustrated in FIGS. 6–9, the selectable logic circuits 410 and 420 are reused for the UART transmitter, the UART receiver, the SPI Master, and the SPI Slave configurations. Moreover, the first data register 310, the second data register 330, and the third data register 350 of the programmable digital circuit block are reused in several of the UART transmitter, the UART receiver, the SPI Master, and the SPI Slave configurations. However, the selectable logic circuit 430 is used in the UART transmitter configuration of FIG. 6 since the UART protocol requires that particular protocol bits (e.g., start bits, stop bits, etc.) to be generated by the UART transmitter.

FIGS. 3–9 illustrate that the programmable digital circuit block can be configured fast and easily. Furthermore, FIGS. 3–9 illustrate that the programmable digital circuit block is highly efficient in terms of die area.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A programmable digital device comprising:
a first programmable digital circuit block which is selectably configurable to perform any one of a plurality of predetermined digital functions, wherein said first programmable digital circuit block is dynamically configurable from any one of said predetermined digital functions to any one of said predetermined digital functions, wherein said first programmable digital circuit block includes:
a first configuration register for receiving and storing a plurality of configuration data corresponding to any one of said plurality of predetermined digital functions, wherein said first configuration register configures said first programmable digital circuit block to perform any one of said plurality of predetermined digital functions based on said configuration data; and
a first plurality of selectable logic circuits which are dependent on said plurality of predetermined digital functions such that to minimize size of said first programmable digital circuit block, wherein said first configuration register configures and selects any of said first plurality of said selectable logic circuits to perform one of said plurality of predetermined digital functions based on said configuration data.

2. The programmable digital device as recited in claim 1 further comprising:
a second programmable digital circuit block which is selectably configurable to perform any one of a plurality of predetermined digital functions, wherein said second programmable digital circuit block is dynamically configurable from any one of said predetermined digital functions to any one of said predetermined digital functions, wherein said second programmable digital circuit block includes:
a second configuration register for receiving and storing a plurality of second configuration data corresponding to any one of said plurality of predetermined digital functions, wherein said second configuration register configures said second programmable digital circuit block to perform any one of said plurality of predetermined digital functions based on said second configuration data; and
a second plurality of selectable logic circuits which are dependent on said plurality of predetermined digital functions such that to minimize size of said second programmable digital circuit block, wherein said second configuration register configures and selects any of said second plurality of said selectable logic circuits to perform one of said plurality of predetermined digital functions based on said second configuration data.

3. The programmable digital device as recited in claim 2 wherein said first and second programmable digital circuit blocks are selectively configurable to couple to one another in series.

4. The programmable digital device as recited in claim 2 wherein said first and second programmable digital circuit blocks are selectively configurable to couple to one another in parallel.

5. The programmable digital device as recited in claim 1 wherein said predetermined digital functions include a timer, a counter, a pulse width modulator (PWM), a cyclic redundancy generator/checker (CRC), a pseudo random sequence generator (PRS), a dead zone delay, a UART transmitter, a UART receiver, a SPI Master, and a SPI Slave.

6. The programmable digital device as recited in claim 1 wherein said predetermined digital functions include a timer, a counter, a pulse width modulator (PWM), a cyclic redundancy generator/checker (CRC), a pseudo random sequence generator (PRS), and a dead zone delay.

7. The programmable digital device as recited in claim 1 wherein said predetermined digital functions are 8-bit predetermined digital functions.

8. A programmable digital device comprising:

an array of programmable digital circuit blocks, each programmable digital circuit block is selectably configurable to perform any one of a plurality of predetermined digital functions, wherein each programmable digital circuit block is dynamically configurable from any one of said predetermined digital functions to any one of said predetermined digital functions, wherein each programmable digital circuit block includes:

a configuration register for receiving and storing a plurality of configuration data corresponding to any one of said plurality of predetermined digital functions, wherein said configuration register configures said programmable digital circuit block to perform any one of said plurality of predetermined digital functions based on said configuration data; and a plurality of selectable logic circuits which are dependent on said plurality of predetermined digital functions such that to minimize size of said programmable digital circuit block, wherein said configuration register configures and selects any of said plurality of said selectable logic circuits to perform one of said plurality of predetermined digital functions based on said configuration data.

9. The programmable digital device as recited in claim 8 wherein each programmable digital circuit block is selectively configurable to couple to another programmable digital circuit block in series.

10. The programmable digital device as recited in claim 8 wherein each programmable digital circuit block is selectively configurable to couple to another programmable digital circuit block in parallel.

11. The programmable digital device as recited in claim 8 wherein said array includes a first group of programmable digital circuit blocks and a second group of programmable digital circuit blocks.

12. The programmable digital device as recited in claim 11 wherein said first group of programmable digital circuit blocks are configurable to perform any one of a first plurality of predetermined digital functions, wherein said first plurality of predetermined digital functions includes a timer, a counter, a pulse width modulator (PWM), a cyclic redundancy generator/checker (CRC), a pseudo random sequence generator (PRS), a dead zone delay, a UART transmitter, a UART receiver, a SPI Master, and a SPI Slave.

13. The programmable digital device as recited in claim 11 wherein said second group of programmable digital circuit blocks are configurable to perform any one of a second plurality of predetermined digital functions, wherein said second plurality of predetermined digital functions includes a timer, a counter, a pulse width modulator (PWM), a cyclic redundancy generator/checker (CRC), a pseudo random sequence generator (PRS), and a dead zone delay.

14. The programmable digital device as recited in claim 8 wherein said predetermined digital functions are 8-bit predetermined digital functions.

15. A controller apparatus comprising:

a first programmable digital circuit block which is selectably configurable to perform any one of a plurality of predetermined digital functions, wherein said first programmable digital circuit block is dynamically configurable from any one of said predetermined digital functions to any one of said predetermined digital functions, wherein said first programmable digital circuit block includes:

a first configuration register for receiving and storing a plurality of configuration data corresponding to any one of said plurality of predetermined digital functions, wherein said first configuration register configures said first programmable digital circuit block to perform any one of said plurality of predetermined digital functions based on said configuration data; and a first plurality of selectable logic circuits which are dependent on said plurality of predetermined digital functions such that to minimize size of said first programmable digital circuit block, wherein said first configuration register configures and selects any of said first plurality of said selectable logic circuits to perform one of said plurality of predetermined digital functions based on said configuration data.

16. The controller apparatus as recited in claim 15 further comprising:

a second programmable digital circuit block which is selectably configurable to perform any one of a plurality of predetermined digital functions, wherein said second programmable digital circuit block is dynamically configurable from any one of said predetermined digital functions to any one of said predetermined digital functions, wherein said second programmable digital circuit block includes:

a second configuration register for receiving and storing a plurality of second configuration data corresponding to any one of said plurality of predetermined digital functions, wherein said second configuration register configures said second programmable digital circuit block to perform any one of said plurality of predetermined digital functions based on said second configuration data; and a second plurality of selectable logic circuits which are dependent on said plurality of predetermined digital functions such that to minimize size of said second programmable digital circuit block, wherein said second configuration register configures and selects any of said second plurality of said selectable logic circuits to perform one of said plurality of predetermined digital functions based on said second configuration data.

17. The controller apparatus as recited in claim 16 wherein said first and second programmable digital circuit blocks are selectively configurable to couple to one another in series.

18. The controller apparatus as recited in claim 16 wherein said first and second programmable digital circuit blocks are selectively configurable to couple to one another in parallel.

19. The controller apparatus as recited in claim 15 wherein said predetermined digital functions include a timer, a counter, a pulse width modulator (PWM), a cyclic redundancy generator/checker (CRC), a pseudo random sequence generator (PRS), a dead zone delay, a UART transmitter, a UART receiver, a SPI Master, and a SPI Slave.

20. The controller apparatus as recited in claim 15 wherein said predetermined digital functions include a timer, a counter, a pulse width modulator (PWM), a cyclic redundancy generator/checker (CRC), a pseudo random sequence generator (PRS), and a dead zone delay.

21. The controller apparatus as recited in claim 15 wherein said predetermined digital functions are 8-bit predetermined digital functions.

* * * * *